(12) United States Patent
Somitsch et al.

(10) Patent No.: US 10,090,454 B2
(45) Date of Patent: Oct. 2, 2018

(54) METHOD FOR PRODUCING AN ELECTRIC CONTACT CONNECTION OF A MULTILAYER COMPONENT

(71) Applicant: EPCOS AG, Munich (DE)

(72) Inventors: Dieter Somitsch, Gross St. Florian (AT); Franz Rinner, Deutschlandsberg (AT); Martin Galler, Kalsdorf (AT); Johann Ramler, Frauental (AT); Reinhard Gabl, Kufstein (AT); Sebastian Brunner, Graz (AT)

(73) Assignee: EPCOS AG, München (DE)

( * ) Notice: Subject to any disclaimer, the term of this patent is extended or adjusted under 35 U.S.C. 154(b) by 75 days.

(21) Appl. No.: 14/380,670

(22) PCT Filed: Feb. 19, 2013

(86) PCT No.: PCT/EP2013/053265
§ 371 (c)(1),
(2) Date: Aug. 22, 2014

(87) PCT Pub. No.: WO2013/124267
PCT Pub. Date: Aug. 29, 2013

(65) Prior Publication Data
US 2015/0022055 A1 Jan. 22, 2015

(30) Foreign Application Priority Data
Feb. 24, 2012 (DE) .................. 10 2012 101 506

(51) Int. Cl.
*H01L 41/047* (2006.01)
*H01L 41/273* (2013.01)
(Continued)

(52) U.S. Cl.
CPC ......... *H01L 41/0472* (2013.01); *H01G 4/232* (2013.01); *H01G 4/252* (2013.01);
(Continued)

(58) Field of Classification Search
CPC . H01L 41/0472; H01L 41/083; H01L 41/273; H01L 41/293; H01L 24/27;
(Continued)

(56) References Cited

U.S. PATENT DOCUMENTS 5,597,494 A 1/1997 Kohno et al.
6,462,464 B2 10/2002 Mitarai et al.
(Continued)

FOREIGN PATENT DOCUMENTS

DE 10153770 A1 6/2002
DE 102006003070 B3 3/2007
(Continued)

*Primary Examiner* — A. Dexter Tugbang
(74) *Attorney, Agent, or Firm* — Slater Matsil, LLP

(57) ABSTRACT

A method for producing an electric contact-connection of a multilayer component is disclosed. In an embodiment, the method includes providing a main body of the multilayer component having internal electrode layers, applying an electrically conductive material and applying a photosensitive material on the electrically conductive material. The method further includes structuring the electrically conductive material via the photosensitive material such that the internal electrode layers alternatingly are covered and uncovered by the electrically conductive material and applying an insulating material after structuring the electrically conductive material such that the internal electrode layers are alternatingly covered by the electrically conductive material and by the insulating material.

8 Claims, 7 Drawing Sheets

(51) Int. Cl.
*H01G 4/33* (2006.01)
*H01L 41/083* (2006.01)
*H01G 4/30* (2006.01)
*H01G 4/232* (2006.01)
*H01G 4/252* (2006.01)
*H01L 41/293* (2013.01)
*H01G 13/00* (2013.01)
*H01L 23/00* (2006.01)

(52) U.S. Cl.
CPC ............... *H01G 4/30* (2013.01); *H01G 4/306* (2013.01); *H01G 4/308* (2013.01); *H01G 4/33* (2013.01); *H01L 41/083* (2013.01); *H01L 41/273* (2013.01); *H01L 41/293* (2013.01); *H01G 13/006* (2013.01); *H01L 24/27* (2013.01); *Y10T 29/42* (2015.01); *Y10T 29/43* (2015.01); *Y10T 29/435* (2015.01)

(58) Field of Classification Search
CPC ........ H01G 4/30; H01G 13/006; H01G 4/232; H01G 4/252; H01G 4/306; H01G 4/308; H01G 4/33; Y10T 29/42; Y10T 29/43; Y10T 29/435
See application file for complete search history.

(56) References Cited

U.S. PATENT DOCUMENTS

| | | | |
|---|---|---|---|
| 7,075,218 B2 | 7/2006 | Matsudo et al. | |
| 7,905,000 B2 | 3/2011 | Ganster et al. | |
| 8,237,333 B2 | 8/2012 | Dorner-Reisel | |
| 2002/0053860 A1* | 5/2002 | Mitarai | H01L 41/083 310/366 |
| 2003/0049425 A1* | 3/2003 | Ono | H01L 24/27 428/217 |
| 2005/0179345 A1 | 8/2005 | Miyoshi | |
| 2006/0138908 A1* | 6/2006 | Iwase | H01L 41/0472 310/366 |
| 2008/0106847 A1* | 5/2008 | Ota | H01G 4/30 361/306.3 |
| 2008/0293209 A1* | 11/2008 | Radall | H01G 4/33 438/381 |
| 2010/0066212 A1 | 3/2010 | Denneler et al. | |
| 2010/0244636 A1 | 9/2010 | Denneler et al. | |

FOREIGN PATENT DOCUMENTS

| | | |
|---|---|---|
| DE | 102007004813 A1 | 8/2008 |
| DE | 102007058873 A1 | 6/2009 |
| DE | 102008027115 A1 | 12/2009 |
| DE | 102009017434 A1 | 10/2010 |
| EP | 1143534 A2 | 10/2001 |
| JP | S61234580 A | 10/1986 |
| JP | 354876 A | 3/1991 |
| JP | 6232466 A | 8/1994 |
| JP | 7162049 A | 6/1995 |
| JP | 08051240 A * | 2/1996 |
| JP | 2005134364 A | 5/2005 |
| JP | 2005183478 A | 7/2005 |
| JP | 2005235880 A | 9/2005 |
| JP | 2006303349 A | 11/2006 |
| JP | 2009246253 A | 10/2009 |
| WO | 2007104678 A1 | 9/2007 |
| WO | 2008101919 A1 | 8/2008 |

* cited by examiner

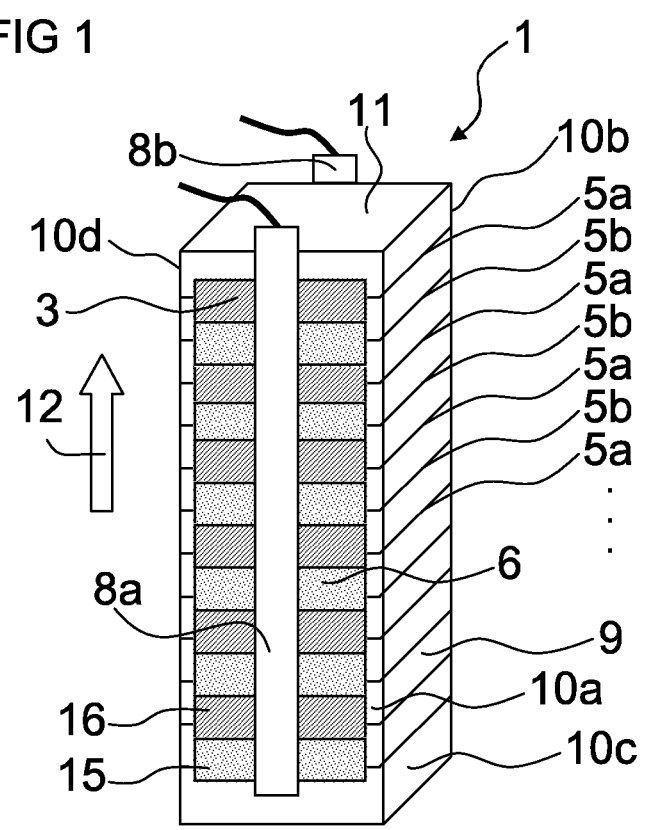

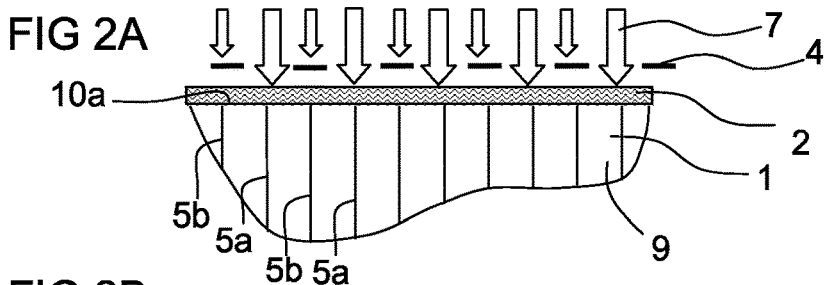
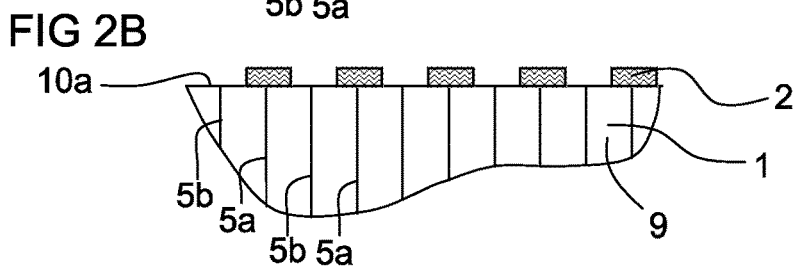
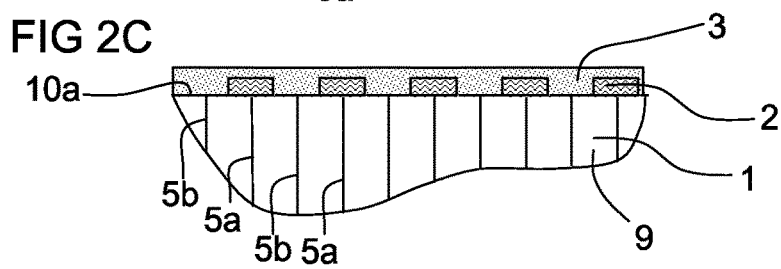
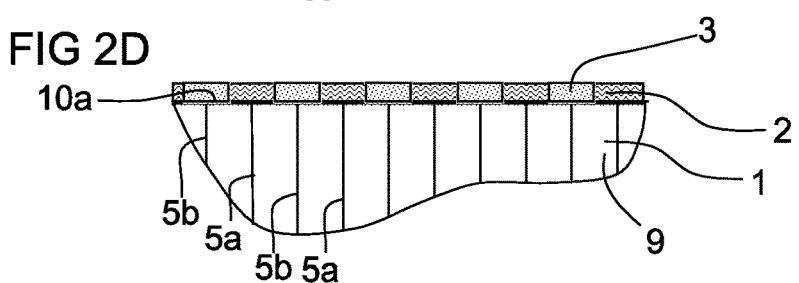
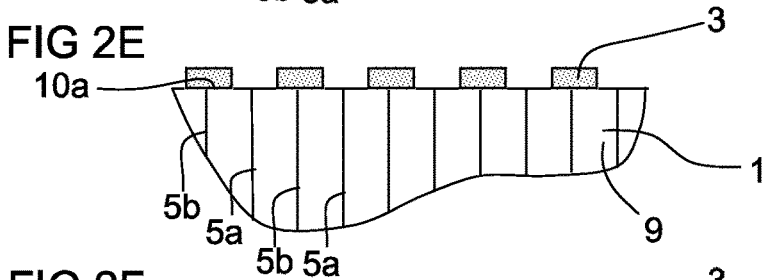
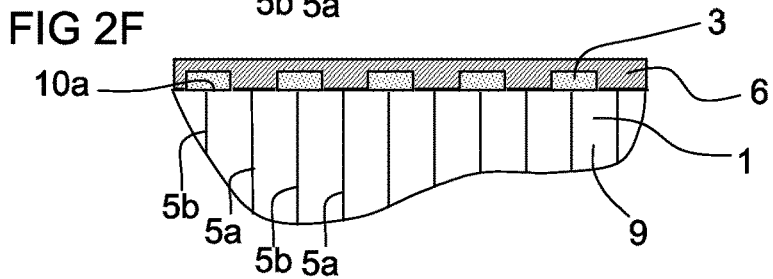

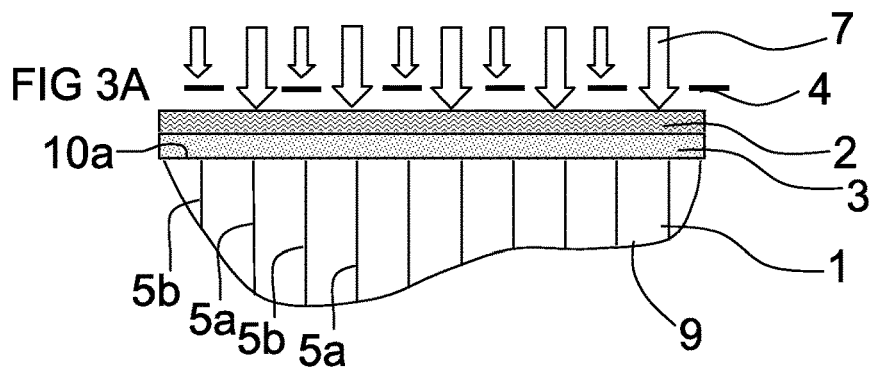
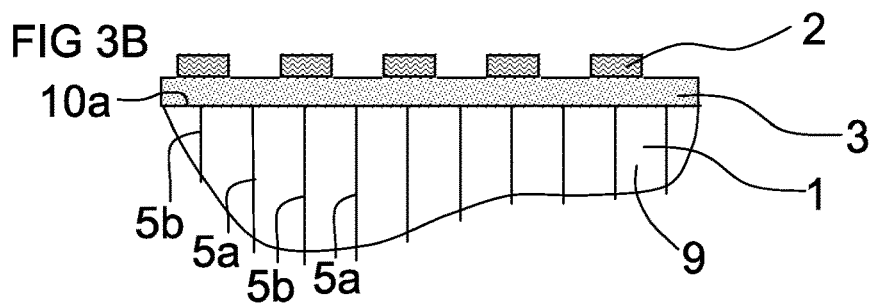
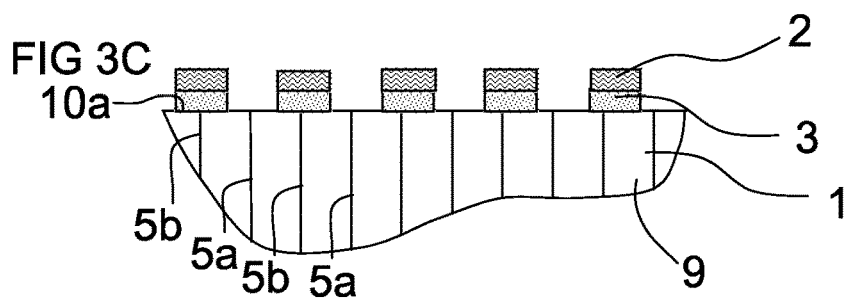
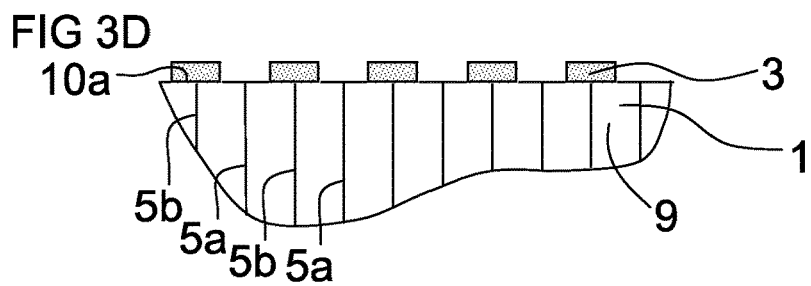
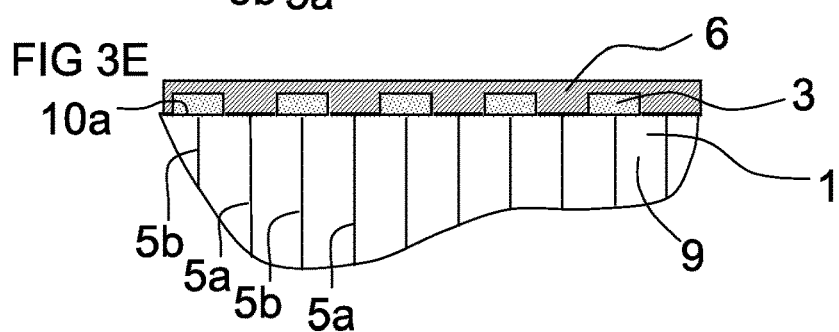

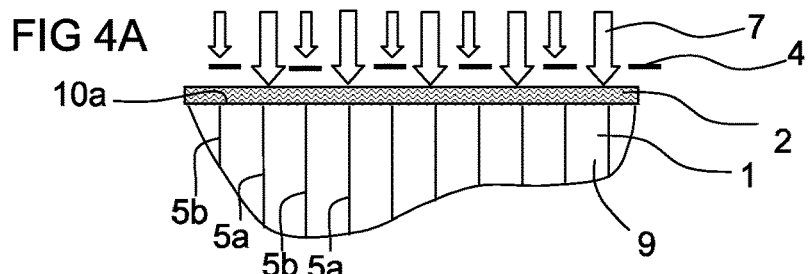
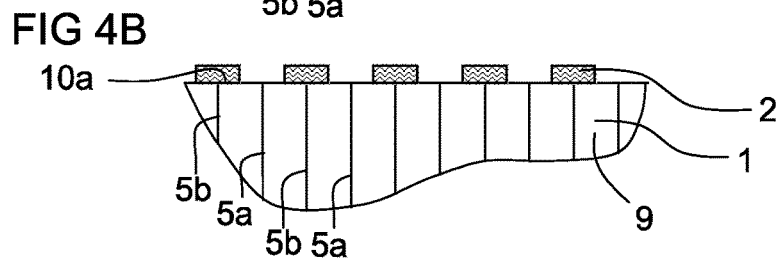
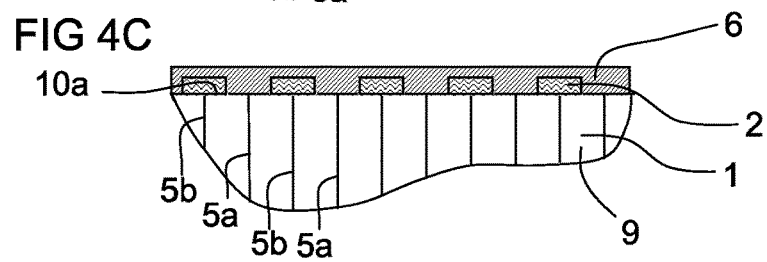
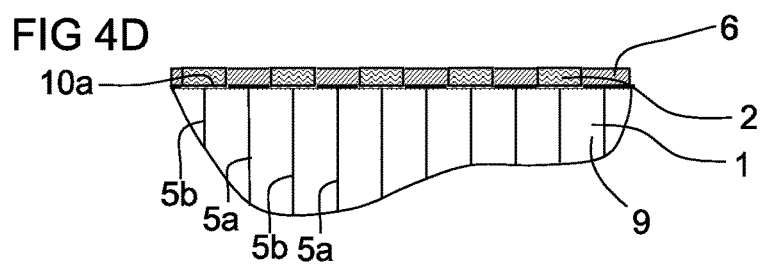
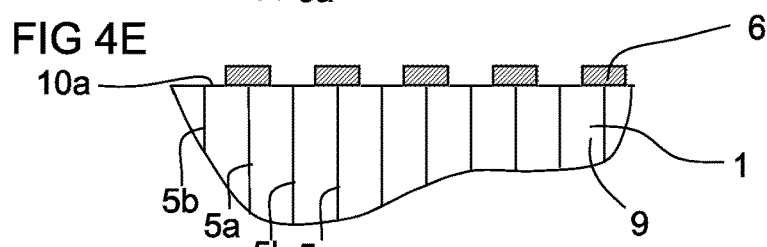
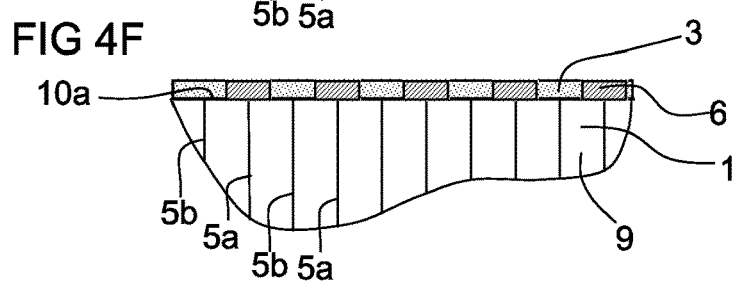

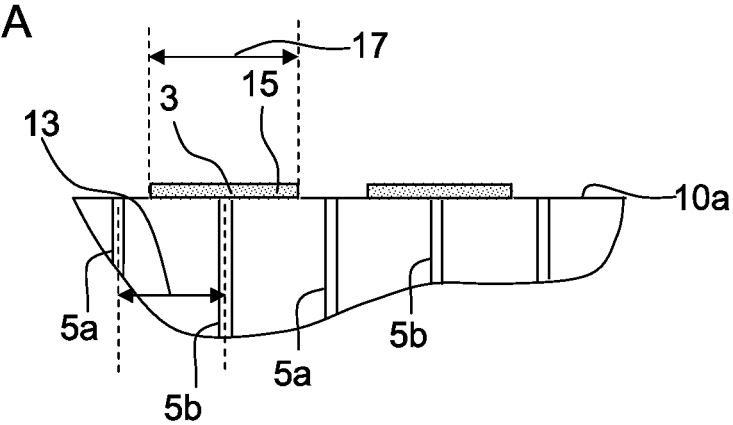
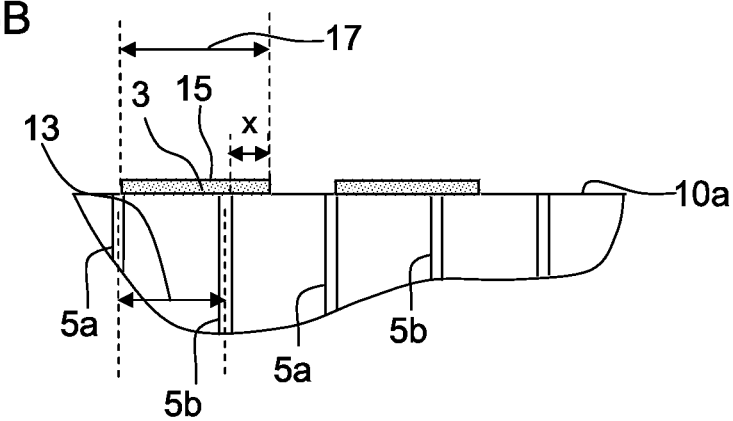
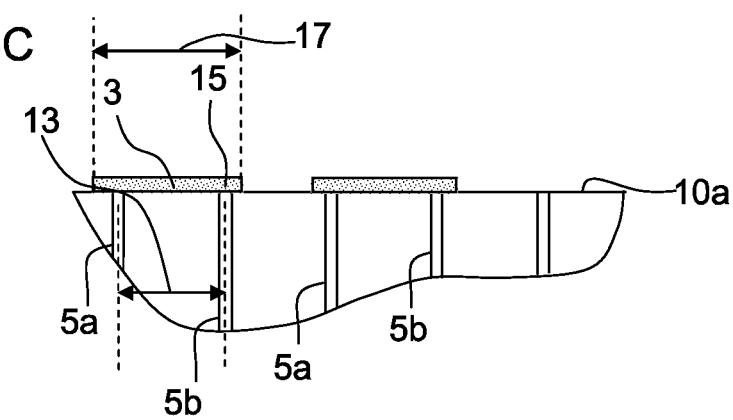

METHOD FOR PRODUCING AN ELECTRIC CONTACT CONNECTION OF A MULTILAYER COMPONENT

This patent application is a national phase filing under section 371 of PCT/EP2013/053265, filed Feb. 19, 2013, which claims the priority of German patent application 10 2012 101 506.6, filed Feb. 24, 2012, each of which is incorporated herein by reference in its entirety.

TECHNICAL FIELD

A method for producing an electric contact-connection of a multilayer component, and a multilayer component with an electric contact-connection are specified. By way of example, the component is a piezoactuator which can be used for actuating an injection valve in a motor vehicle.

BACKGROUND

German patent publication DE 10 2007 058 873 A1 discloses a piezoactuator comprising a photopatternable insulating material. German patent publication DE 10 2006 003 070 B3 discloses a piezoactuator in which an insulating material is structured by means of a laser.

SUMMARY OF THE INVENTION

Embodiments of the invention specify an improved method for producing an electric contact-connection of a multilayer component and a multilayer component with an improved electric contact-connection.

A method for producing an electric contact-connection of a multilayer component is specified. The method comprises in a step A) providing a main body of the multilayer component having internal electrode layers. Furthermore, in a step B) an insulating material, an electrically conductive material and a photosensitive material are provided. In a step C) preferably the insulating material and the electrically conductive material are arranged in a structured manner on an outer side of the main body for the alternate contact-connection of the internal electrode layers, wherein the structured arrangement is produced by the photosensitive material.

The main body can comprise a stack composed of dielectric layers. By way of example, dielectric layers and internal electrode layers are stacked along a stacking direction. The stacking direction preferably corresponds to the longitudinal direction of the main body. Preferably, dielectric layers and internal electrode layers are stacked alternately one above another.

The dielectric layers can comprise a piezoelectric material, for example, a ceramic material. Green sheets can be used for producing the main body, a metal paste, for example, being applied to said green sheets in order to form internal electrode layers. By way of example, the metal paste is applied in a screen printing method. The metal paste can contain copper. By way of example, internal electrode layers containing copper as main constituent are formed therefrom. Alternatively, the metal paste can contain silver-palladium, wherein internal electrode layers containing silver-palladium as main constituent can be formed therefrom. After the metal paste has been applied, the sheets are preferably stacked, pressed and jointly sintered, thus giving rise to a monolithic sintered body. Preferably, the main body of the component is formed by a monolithic sintered body, for example, by a sintered body produced in the manner described above.

By way of example, the multilayer component is embodied as a piezoelectric component, for example, as a piezoactuator. In the case of a piezoactuator, when a voltage is applied to the internal electrode layers, piezoelectric layers arranged between the internal electrode layers expand, such that a stroke of the piezoactuator is generated. The multilayer component can also be embodied as a different component, for example, as a multilayer capacitor.

The term "piezoelectric layer" preferably denotes a portion of the stack which comprises a piezoelectric material and is bounded by two adjacent internal electrode layers in the stacking direction. A piezoelectric layer can be formed from one or a plurality of piezoelectric plies arranged one above another along the stacking direction. By way of example, a piezoelectric ply can be produced from a green sheet. A piezoelectric layer can also comprise just a single piezoelectric ply.

The multilayer component is preferably a fully active multilayer component. In the case of a fully active multilayer component, the internal electrode layers extend over the entire cross section of the main body. The dielectric layers are thus completely covered by the internal electrode layers. The multilayer component is, in particular, free of inactive zones between adjacent electrode layers. The term inactive zone denotes a region between two adjacent electrode layers of different polarities in which the electrode layers do not overlap.

In order to apply a voltage between internal electrode layers that are adjacent in the stacking direction, preferably at least two external electrodes are provided. By way of example, two external electrodes are arranged on opposite outer sides of the main body. Preferably, the external electrodes are in mechanical contact with the insulating material and the electrically conductive material. Preferably, the internal electrode layers, in the stacking direction, are alternately electrically connected to one of the external electrodes and electrically insulated from the other external electrode. This alternate electric contact-connection is preferably achieved by means of the structured arrangement of insulating material and electrically conductive material.

The insulating material and the electrically conductive material are preferably applied directly on the outer side of the main body. Preferably, the insulating material and the electrically conductive material are in direct mechanical contact with the internal electrode layers. Preferably, the insulating material and the electrically conductive material are arranged alternately above the internal electrode layers in the stacking direction. By way of example, the insulating material and the electrically conductive material are arranged in strip-shaped fashion above the internal electrode layers. As a result, by way of example an internal electrode layer on an outer side of the main body is completely covered by insulating material or by electrically conductive material. Alternatively, only a partial region of the internal electrode layers is covered by insulating material or by electrically conductive material.

In one preferred embodiment, the insulating material is applied in the form of insulation webs to the internal electrode layers. Preferably, the insulation webs run perpendicularly to the stacking direction. In one preferred embodiment, the width of at least one insulation web in the stacking direction is greater than a distance between two adjacent internal electrode layers. In one preferred embodiment, a multiplicity of insulation webs are arranged on an outer side, respectively. Preferably, the electrically conductive material is applied in the form of contact webs to the internal electrode layers. Preferably, contact webs and insulation webs alternate in the stacking direction. In one preferred embodiment, a multiplicity of contact webs are arranged on an outer side, respectively.

The insulating material preferably comprises an electrically insulating material. The insulating material can contain, for example, glass, ceramic powder or an organic insulating lacquer. The insulating material can be applied, for example, by means of lamination, printing or spraying. Preferably, the insulating material is applied as a layer.

The electrically conductive material can be applied by means of sputtering, for example. Alternatively, the electrically conductive material can be applied as metal paste that is subsequently fired. Alternatively, the electrically conductive material can comprise a conductive adhesive. The electrically conductive material can be, for example, a metal-containing material or a metallic material. Preferably, the electrically conductive material is applied as a layer.

Preferably, in one method step, the photosensitive material is applied and structured on an outer side of the main body of the multilayer component. Preferably, the photosensitive material is applied and structured on at least one outer side of the main body in order to produce the structured arrangement of insulating material and electrically conductive material.

Preferably, the photosensitive material is applied as a layer. The photosensitive material is preferably applied and structured on two opposite outer sides of the main body. Preferably, the photosensitive material is structured such that after the structuring at least one partial region above every second internal electrode layer on the outer side of the main body is free of photosensitive material.

The photosensitive material is preferably structured by means of lithography. In particular, the photosensitive material can be understood as a material to be structured that is structurable by photolithography or laser lithography.

By way of example, the photosensitive material is structured by means of photolithography. Photolithography is based on the principle that a photosensitive material is structured by photographic exposure. A local change in the chemical properties of the photosensitive material can take place by means of the photographic exposure. By way of example, a photosensitive material can be cured by exposure. The non-cured regions can subsequently be removed. By way of example, the exposed regions can be removed by a solvent which dissolves only the exposed regions, but not the unexposed regions of the photosensitive material. Alternatively, the solvent can dissolve the unexposed regions, but not the exposed regions.

By way of example, the photosensitive material comprises a photoresist. Preferably, the photosensitive material differs from the insulating material, in particular in terms of its chemical composition.

The photosensitive material can serve as a mask for the structured arrangement of the insulating material and of the electrically conductive material. By way of example, by means of the photosensitive material, the insulating material or the electrically conductive material is applied in a targeted manner only at predetermined locations on the outer side of the main body, e.g., above every second internal electrode layer. Alternatively, by means of the photosensitive material, the insulating material or the electrically conductive material is removed in a targeted manner at predetermined locations, e.g., above every second internal electrode layer.

Preferably, the main body of the multilayer component is measured before the structuring of the photosensitive material, in order to obtain an accurate positioning of the insulating material and of the electrically conductive material. By way of example, the main body is measured by means of optical inspection.

This measurement makes it possible, for example, to determine the position of the internal electrode layers within the stack. By way of example, the structuring of the photosensitive material can be adapted to different stack heights and different thicknesses of the dielectric layers. Consequently, the structured arrangement of insulating material and electrically conductive material can be individually adapted to the main body. This can ensure that each internal electrode layer is sufficiently covered with insulating material or with electrically conductive material on an outer side of the main body.

The structuring of the photosensitive material can be effected by means of an exposure mask. The exposure mask is preferably embodied such that regions of the photosensitive material which lie above every second internal electrode layer on an outer side of the main body are exposed during an exposure. The regions above the other internal electrode layers are not exposed.

The exposure mask can be selected in accordance with the result of the preceding measurement of the main body. In this case, the exposure mask can be individually adapted to the stack height of the main body and to the position of the internal electrode layers. By way of example, for this purpose, it is possible to select an appropriate exposure mask from a set of exposure masks. The selection is made, for example, according to a so-called classification. Alternatively, the imaging scale of the imaged exposure mask can be adapted to the stack height by means of a so-called projection exposure. In this case, the distance between the main body and the exposure mask can be set such that the correct imaging scale arises.

During the process for producing the main body it can happen, e.g., on account of production tolerances, that the distances between the internal electrode layers are different. Such different distances can be caused, for example, by pressing warpage or different sintering shrinkage during the production of the main body. In this case, it is possible that the structure of the exposure mask does not correspond exactly to the arrangement of the internal electrode layers. As a result, there is the risk that the internal electrode layers are not covered alternately with insulating material and with electrically conductive material on an outer side of the main body, rather that, for example, two adjacent internal electrode layers are covered by electrically conductive material on an outer side of the main body. As a result, there is the risk of short circuits.

In order to avoid the risk of short circuits during operation, the insulating material is preferably structured such that the width of an insulation web in the stacking direction is greater than a distance between two adjacent internal electrode layers. Preferably, the width of the insulation web is at least equal to the distance between two adjacent internal electrode layers plus the thickness of an internal electrode layer. The distance between two adjacent internal electrode layers is measured from the center of the electrode layers, respectively.

Preferably, the insulation web is larger than the distance between two adjacent internal electrode layers by a width x. The width x is also designated as overlap. Preferably, the overlap of the insulation web is chosen in such a way that a reliable insulation of the internal electrode layers is ensured.

Preferably, as a result, even in the case of an inaccurate positioning of the insulation web on the outer side, at least every second internal electrode layer is covered with insulating material on an outer side of the main body. Preferably, the width x is less than the distance between two internal electrode layers.

In the case where the structure of the exposure mask does not correspond exactly to the arrangement of the internal electrode layers on account of different distances between the internal electrode layers, it can happen on account of the width of the insulation webs that two or more adjacent internal electrode layers are covered with insulating material on the same outer side. As a result, an incorrect contact-connection of the multilayer component can occur, such that one or more electrodes are not contact-connected. Such incorrectly contact-connected components can be identified by an electrical measurement and sorted out. Consequently, the component can already be sorted out before being delivered and put into operation, with the result that failure of the component during operation is avoided.

By way of example, the width of the insulation web in the stacking direction amounts to at least the width of the contact web in the stacking direction multiplied by the factor 1.1. By way of example, the width of the insulation web in the stacking direction amounts to the width of the contact web in the stacking direction multiplied by the factor 2.0. Preferably, the width of the insulation web in the stacking direction amounts to the width of the contact web in the stacking direction multiplied by a factor of 1.3 to 1.5.

The risk of an incorrect contact-connection occurs primarily in the case of a structuring by means of mask technology. The risk of an incorrect contact-connection is reduced in the case of a structuring by means of a self-aligning method.

Alternatively, the desired regions of a material to be structured can be exposed by targeted progression. This can be carried out using a laser, for example. This is referred to as laser lithography. Preferably, an insulation web having an overlap is applied in the laser lithography method as well.

In one embodiment, the photosensitive material is applied before the insulating material and the electrically conductive material are applied.

The photosensitive material is preferably applied on at least one outer side of the main body. Preferably, the photosensitive material is applied on two opposite outer sides of the main body. In one embodiment, the photosensitive material can be applied directly to the surface of the main body, such that it is in direct mechanical contact with the dielectric layers and the internal electrode layers.

Subsequently, the photosensitive material is structured in the manner described above.

After the structuring of the photosensitive material, preferably every second internal electrode layer is covered with photosensitive material on an outer side of the main body. The other electrode layers are preferably free of photosensitive material.

After the structuring of the photosensitive material, insulating material is applied, for example.

Preferably, the insulating material is applied to the uncovered internal electrode layers. The insulating material can be applied such that both the uncovered internal electrode layers and the photosensitive material are covered with insulating material. After the insulating material has been applied, the internal electrode layers are preferably alternately covered with photosensitive material and with insulating material.

In a further, in particular subsequent, method step, the photosensitive material can be removed. Preferably, uncovered internal electrode layers are formed as a result.

By way of example, the internal electrode layers are at least partly uncovered.

By way of example, the photosensitive material can be removed in a so-called lift-off method. For the use of the lift-off method, by way of example, the photosensitive material is structured such that it has a negative flank. No insulating material is applied to the negative flank of the photosensitive material. In a later method step, said negative flank can serve as an area of attack for the removal of the photosensitive material. For example, a solvent can act on said negative flank in a later method step, as a result of which the photosensitive material can be removed. In this case, insulating material adhering to the photosensitive material can be removed together with the photosensitive material.

Alternatively, before the removal of the photosensitive material, the insulating material can be removed to an extent such that at least the photosensitive material is no longer covered by insulating material. The insulating material can be removed by sandblasting, grinding or milling, for example. The photosensitive material can subsequently be removed by a solvent.

Preferably, the photosensitive material is then completely removed from the main body of the multilayer component. Preferably, after the removal of the photosensitive material, every second internal electrode layer is covered with insulating material on an outer side of the main body. Preferably, every second internal electrode layer is completely covered with insulating material on an outer side of the main body. Preferably, the other electrode layers are at least partly free of insulating material.

In a further, in particular subsequent, method step, preferably the electrically conductive material is applied to the uncovered internal electrode layers.

For this purpose, the electrically conductive material is preferably applied in a planar manner to that outer side of the main body on which the insulating material is arranged in a structured manner. As a result, every second internal electrode layer is contact-connected with electrically conductive material on an outer side of the main body, while the other internal electrode layers are covered with insulating material on the outer side of the main body.

The electrically conductive material can be applied by means of a method described above.

In an alternative embodiment of the method, the electrically conductive material is preferably applied before the insulating material is applied.

By way of example, firstly the photosensitive material is applied to an outer side of the main body and structured. Electrically conductive material is subsequently applied to the structured photosensitive material.

In a further, preferably subsequent, method step, the photosensitive material can be removed. Preferably, uncovered internal electrode layers are formed as a result.

The removal of the photosensitive material can take place in the manner described above.

By way of example, the electrically conductive material adhering to the structured photosensitive material is removed together with the photosensitive material. As a result, preferably every second internal electrode layer is covered with electrically conductive material on an outer side of the main body. Preferably, the other electrode layers are free of electrically conductive material on the outer side of the main body.

In a further, in particular subsequent, method step, insulating material is preferably applied to the uncovered internal electrode layers.

The insulating material is preferably applied such that the electrically conductive material is not covered with insulating material. By way of example, the insulating material has a low adhesion on the electrically conductive material. By way of example, the insulating material can be embodied such that it adheres on the surface of the main body, but does not adhere on the electrically conductive material. Alternatively, in an additional method step, part of the insulating material can be removed, such that the electrically conductive material is not covered with insulating material. By way of example, the insulating material can be removed by sandblasting, grinding or milling.

In a further alternative embodiment of the method, at least one material from the insulating material and the electrically conductive material is applied and the photosensitive material is then applied.

By way of example, firstly insulating material is applied to the outer side of the main body. By way of example, the insulating material is applied as a layer. The photosensitive material can subsequently be applied to the insulating material.

In a further, in particular subsequent, step, the photosensitive material is structured. By way of example, the photosensitive material is structured by means of photolithography.

The photosensitive material is preferably structured such that photosensitive material is situated above every second internal electrode layer on the outer side of the main body. The material, for example, the insulating material, applied below the photosensitive material initially remains unchanged in this case.

In a further, preferably subsequent, step, the at least one material from the insulating material and the electrically conductive material is structured. Preferably, the photosensitive material serves as a mask during the structuring.

In particular, a layer lying below the photosensitive material is preferably structured such that every second internal electrode layer is uncovered and every other second internal electrode layer is covered. By way of example, a layer composed of insulating material lying below the photosensitive material is structured. By way of example, the layer is structured such that every other second internal electrode layer is covered with insulating material.

The material applied first can be structured by means of an etching method, for example. In this case, only that region of the layer lying below the photosensitive material which is not covered with photosensitive material is removed. The photosensitive material can function as an etching stop, in particular. Alternatively, the layer lying below the photosensitive material can be structured by means of a solvent.

Subsequently, the photoresist can be removed, for example, by means of a solvent.

In accordance with one embodiment, the structuring of the photosensitive material and of the material applied below the photosensitive material can be effected by means of three different solvents. The different solvents can selectively etch different materials.

Subsequently, electrically conductive material, for example, can be applied in a planar manner to the outer side of the main body. The electrically conductive material is preferably applied to that outer side of the main body on which the insulating material is applied in a structured manner. The electrically conductive material preferably covers the uncovered internal electrode layers and the insulating material.

Preferably, every second internal electrode layer is then directly covered with electrically conductive material. The other electrode layers are directly covered with insulating material.

Alternatively, electrically conductive material can be applied below the photosensitive material. The photosensitive material is preferably structured in the manner described above.

Subsequently, the electrically conductive material is preferably structured such that every second internal electrode layer is covered with electrically conductive material. For example, the electrically conductive material can be structured in an etching method. In this case, the structured photosensitive material can function as an etching stop. The photosensitive material is subsequently removed. Insulating material can subsequently be applied to the uncovered internal electrode layers.

Preferably, the photosensitive material is firstly applied during the production method and is completely removed in the course of the method.

The photosensitive material can be removed using a solvent, for example. Alternatively, the photosensitive material can be removed by means of milling, sandblasting or grinding.

Preferably, the photosensitive material serves only as a mask for the structured arrangement of the insulating material and of the electrically conductive material during the production method.

After the structured arrangement of electrically conductive material and insulating material, at least one external electrode can be fitted to the main body. Preferably, two external electrodes are fitted. The two external electrodes are preferably fitted on two opposite outer sides of the main body, to be precise on the outer sides on which the insulating material and the electrically conductive material are arranged in a structured manner. By way of example, an external electrode is applied in a planar manner to an outer side of the main body. The internal electrode layers can be electrically contact-connected via the external electrodes. Preferably, the external electrodes are in contact with the internal electrode layers alternately via the electrically conductive material.

Furthermore, a multilayer component is specified, comprising a main body having internal electrode layers and also an electrically conductive material and an insulating material. The insulating material and the electrically conductive material are arranged in a structured manner on an outer side of the main body for the alternate contact-connection of the internal electrode layers. The structured arrangement of the insulating material and of the electrically conductive material is produced by means of photosensitive material. Preferably, the multilayer component is produced in accordance with the method described above.

Furthermore, a multilayer component is specified, comprising a main body having internal electrode layers and also an insulating material and an electrically conductive material. Preferably, the multilayer component is produced by a method as described above. However, the multilayer component can also be produced by an alternative method. By way of example, the insulating material can be embodied as photosensitive material. Consequently, by way of example, part of the photosensitive material remains on the outer side of the main body after the photopatterning and serves for insulating the internal electrode layers.

Preferably, the insulating material and the electrically conductive material are arranged in a structured manner on an outer side of the main body for the alternate contact-connection of the internal electrode layers. The structured arrangement of the insulating material is preferably produced by means of photopatterning. Preferably, the insulating material forms insulation webs above internal electrode layers, wherein a width of an insulation web in the stacking direction is greater than a distance between two adjacent internal electrode layers. By way of example, the electrically conductive material forms contact webs above the internal electrode layers. Preferably, contact webs and insulation webs alternate in the stacking direction.

Furthermore, a method for producing an electric contact-connection of a multilayer component is specified, wherein a main body having internal electrode layers is provided. By way of example, the method corresponds to the method described above. However, an alternative method can also be used. By way of example, the insulating material and the electrically conductive material can be applied by means of a screen printing method. Preferably, a non-self-aligning method is used.

Preferably, the main body is measured in order to determine the position of the internal electrode layers. Preferably, insulation webs for alternately insulating the internal electrode layers are subsequently applied, wherein respective insulation web has a width in the stacking direction which is greater than a distance between two adjacent internal electrode layers.

Such a width is particularly advantageous if the insulation webs are positioned on the outer side by means of a non-self-aligning method, since in such methods it can happen that the insulation webs are positioned on the internal electrodes inaccurately owing to a non-uniform distance between the internal electrode layers. The configuration of the insulation webs having a width greater than the distance between two adjacent internal electrode layers makes it possible to prevent a short circuit or electrical breakdown of adjacent electrode layers during the operation of the component.

BRIEF DESCRIPTION OF THE DRAWINGS

The method for producing a multilayer component and the multilayer component are explained below with reference to schematic figures, which are not true to scale.

In the figures:

FIG. 1 shows a perspective view of a piezoelectric multilayer component;

FIGS. 2A to 2F show steps in the production of the piezoelectric multilayer component in accordance with FIG. 1;

FIGS. 3A to 3E show steps of an alternative production method for producing the piezoelectric multilayer component in accordance with FIG. 1;

FIGS. 4A to 4F show steps of a further production method for producing the piezoelectric multilayer component in accordance with FIG. 1;

FIGS. 5A to 5C show different possible positionings of an insulation web during the structuring of the insulating material;

DETAILED DESCRIPTION OF ILLUSTRATIVE EMBODIMENTS

Figure 6:
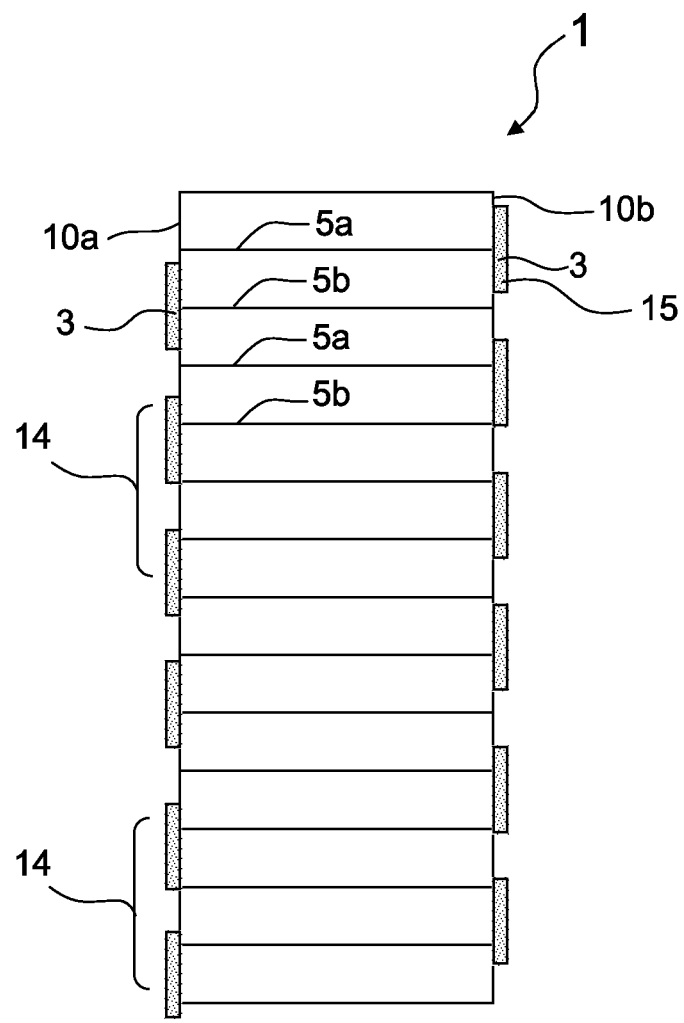
FIG. 6 shows a multilayer component with non-contact-connected regions in a side view.
Figure 7A:
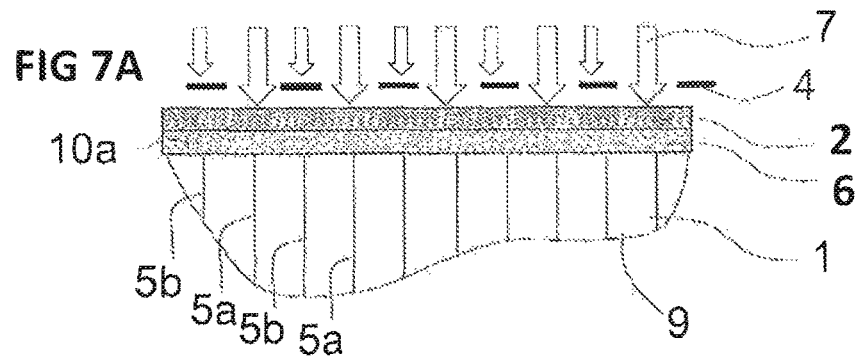
FIG. 7A shows a multilayer component with internal electrode layers.
Figure 7B:
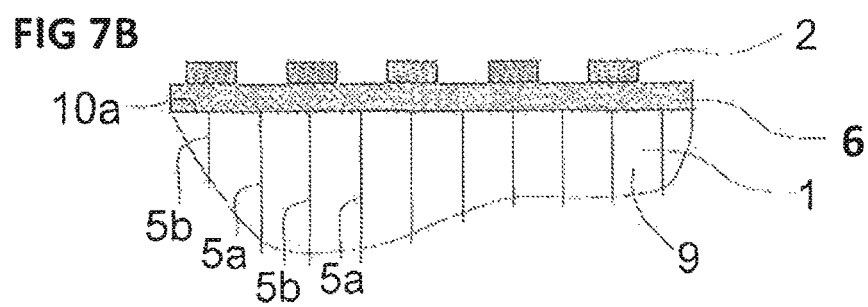
FIGS. 7B to 7D show steps of structuring the electrically conductive material via the photosensitive material.
Figure 7C:
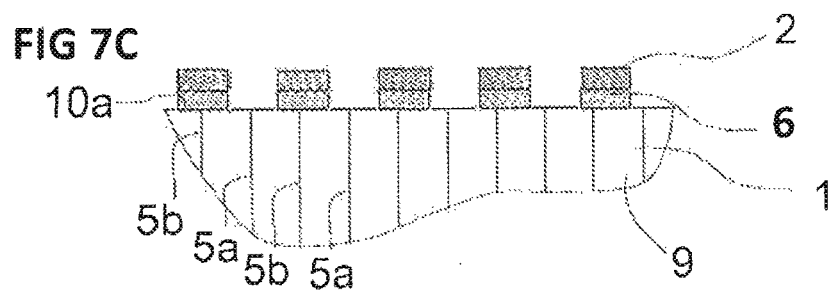
Figure 7D:
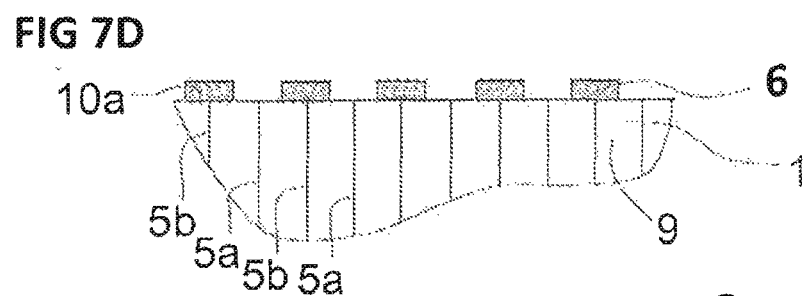
Figure 7E:
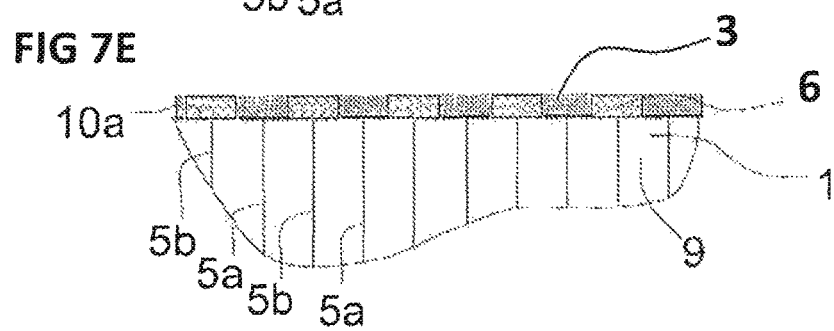
FIG. 7E shows the applied insulating layer.

FIG. 1 shows a perspective illustration of a multilayer component 1 in the form of a piezoactuator.

The multilayer component 1 comprises a main body 11 composed of piezoelectric layers 9 arranged one above another and internal electrode layers 5a, 5b lying between them. The main body 11 is embodied as a monolithic sintered body. The piezoelectric layers 9 and the internal electrode layers 5a, 5b are arranged one above another along a stacking direction 12 corresponding to the longitudinal direction of the main body 11. In this case, first internal electrode layers 5a and second internal electrode layers 5b are arranged one above another alternately between the piezoelectric layers 9. When a voltage is applied, the multilayer component 1 expands in the stacking direction 12.

The piezoelectric layers 9 contain a ceramic material, for example, lead zirconate titanate (PZT) or a lead-free ceramic. The ceramic material can also contain dopants. The internal electrode layers 5a, 5b contain silver-palladium or copper, for example.

In order to produce the multilayer component 1, by way of example, green sheets containing a ceramic powder, an organic binder and a solvent are produced by sheet drawing or sheet casting. For forming the internal electrode layers 5a, 5b, an electrode paste is applied to some of the green sheets by means of screen printing. The green sheets are stacked one above another along the stacking direction 12 and pressed. Finally, the stack composed of piezoelectric green sheets and internal electrode layers 5a, 5b is sintered.

In this case, a piezoelectric layer 9 denotes a region of the main body 11 which contains a piezoelectric material and is bounded by two adjacent internal electrode layers 5a, 5b in the longitudinal direction. A piezoelectric layer 9 can contain a plurality of plies. By way of example, a piezoelectric ply is produced from a green sheet.

The multilayer component 1 is embodied as a fully active piezoactuator. In the case of a fully active piezoactuator, the internal electrode layers 5a, 5b extend at all locations as far as the outer sides 10a, 10b, 10c, 10d of the main body. In this case, the internal electrode layers 5a, 5b cover the entire cross-sectional area of the main body, i.e., the piezoelectric layers 9 are completely covered by the internal electrode layers 5a, 5b.

The first internal electrode layers 5a are contact-connected on a first outer side 10a of the main body 11, and the second internal electrode layers 5b are contact-connected on an opposite second outer side 10b. As a result of this alternate contact-connection of the internal electrode layers 5a, 5b, a voltage is generated between two adjacent internal electrode layers 5a, 5b.

For the alternate contact-connection of the internal electrode layers 5a, 5b, in the exemplary embodiment shown here, an insulating material 3 and an electrically conductive material 6 are arranged in a structured manner on the outer sides 10a, 10b of the main body 11. The insulating material 3 and the electrically conductive material 6 are arranged such that the internal electrode layers 5a, 5b are covered alternately with insulating material 3 and with electrically conductive material 6 on an outer side 10a, 10b. In this case, the insulating material 3 and the electrically conductive material 6 are arranged, for example, in a strip-shaped fashion on the internal electrode layers 5a, 5b. In particular, the insulating material 3 forms insulation webs 15 and the electrically conductive material 6 forms contact webs 16 on the internal electrode layers 5a, 5b. By way of example, approximately the entire outer sides 10a, 10b are covered by the insulating material 3 and the electrically conductive material 6. Alternatively, only a partial region of the outer sides 10a, 10b is covered by the insulating material 3 and the electrically conductive material 6, respectively.

The structured arrangement of the insulating material 3 and of the electrically conductive material 6 is produced with the aid of a photosensitive material 2. For this purpose, the photosensitive material 2 is structured and serves, for example, as a mask for applying the insulating material 3 and the electrically conductive material 6. In the course of the production method, the photosensitive material 2 is completely removed from the multilayer component 1.

The piezoelectric multilayer component 1 additionally comprises a first external electrode 8a and a second external electrode 8b, which are arranged externally on the main body 11 of the multilayer component 1. In the exemplary embodiment shown here, the external electrodes 8a, 8b are arranged on opposite outer sides 10a, 10b of the piezoelectric multilayer component 1. The external electrodes 8a, 8b run in a strip-shaped fashion along the stacking direction 12. The external electrodes 8a, 8b contain silver-palladium or copper, for example, and can be applied and soldered as sheet metal onto the main body 11.

On account of the structured arrangement of insulating material 3 and electrically conductive material 6, on a first outer side 10a every first internal electrode layer 5a is electrically contact-connected via an external electrode 8a, respectively. The second internal electrode layers 5b are electrically insulated from said external electrode 8a. On the opposite second outer side 10b, the second internal electrode layers 5b are contact-connected by the external electrode 8b.

FIGS. 2A to 2F show a basic schematic diagram concerning the production of a piezoelectric multilayer component in accordance with FIG. 1. The structured arrangement of insulating material 3 and electrically conductive material 6 on an outer side 10a of the multilayer component 1 is produced by means of a photosensitive material 2 in this case.

FIGS. 2A to 2F respectively show in a side view an excerpt from a piezoelectric component in an intermediate state during the production of the multilayer component 1 shown in FIG. 1.

As shown in FIG. 2A, a photosensitive material 2 is applied on a first outer side 10a of the multilayer component 1. Preferably, photosensitive material 2 is also applied on a second outer side 10b. The photosensitive material 2 is a photoresist, for example. Said photoresist is applied at the two outer sides 10a, 10b provided for the external electrodes 8.

Before the photosensitive material 2 is applied, the main body 11 is measured in order to determine the exact size of the main body 11 and the exact positions of the internal electrode layers 5a, 5b. This measurement is carried out by means of an optical measuring method, for example. With an exposure mask 4 individually adapted to the main body 11, the photosensitive material 2 is structured by means of an exposure 7. This is carried out in accordance with the principle of optical lithography. By way of example, the photosensitive material 2 decomposes at the exposed locations. Alternatively, the photosensitive material 2 cures at the exposed locations, while the non-exposed photosensitive material 2 can easily be removed.

The exposure mask 4 can be selected from a set of exposure masks, for example. Alternatively, the exposure 7 can be effected by means of a so-called projection exposure, in which the imaging scale of the imaged exposure mask 4 is correspondingly adapted to the geometry of the main body 11 by means of the imaging optical unit.

Alternatively, individual regions of the photosensitive material 2 can be exposed in a targeted manner. By way of example, it is possible to progress over the regions to be exposed in a targeted manner. This can be carried out using a laser, for example. This is referred to as laser lithography. The laser lithography method is generally a maskless exposure method.

The exposure 7 results in the structured arrangement of the photosensitive material 2 as shown in FIG. 2B. The photosensitive material 2 is structured such that every first internal electrode layer 5a is covered with photosensitive material 2 on an outer side 10a, and every second internal electrode layer 5b is free of photosensitive material 2. On the outer side 10b, analogously the other internal electrode layers 5a, 5b are respectively covered with photosensitive material and free of photosensitive material (not illustrated).

Insulating material 3 is subsequently applied to the uncovered second internal electrode layers 5b, as shown in FIG. 2C. The insulating material 3 can contain glass, ceramic powder or organic insulating material, for example. The insulating material 3 can be applied by means of printing, spraying, sputtering or vapor deposition, for example. The insulating material 3 and the photosensitive material 2 are different materials.

Afterward, the first internal electrode layers 5a provided for contact-connection by an external electrode 8 are freed of the photosensitive material 2. Under certain circumstances, before the removal of the photosensitive material 2, an additional process step is required which ensures that the photosensitive material 2 is not covered with insulating material 3, as shown in FIG. 2D. Such excess insulating material 3 can be removed by stripping, polishing, sandblasting, grinding or milling, for example.

The photosensitive material 2 above the first electrode layers 5a provided for contact-connection by an external electrode 8 can be removed in a so-called lift-off method, for example. In this case, the photosensitive material 2 is developed such that a negative flank arises, thus giving rise to a shading effect for the insulating material 3 applied. During the application of the insulating material 3, the negative flank remains free of insulating material 3. A solvent can subsequently act on said flank, as a result of which the photosensitive material 2 can be removed together with the insulating material 3 adhering thereon.

As shown in FIG. 2E, every second internal electrode layer 5b is then covered with insulating material 3. The other internal electrode layers 5a are uncovered.

As shown in FIG. 2F, electrically conductive material 6 is then applied on the first outer side 10a. In this case, every uncovered first internal electrode layer 5a is covered with electrically conductive material 6; the second internal electrode layers 5b are covered by the insulating material 3. On the opposite outer side 10b, equally the second internal electrode layers 5b are covered with electrically conductive material and the first internal electrode layers 5a with insulating material.

The electrically conductive material 6 can be a metal paste or a conductive adhesive, for example. The electrically conductive material 6 is preferably fired or cured. Afterward, a first external electrode 8a is fitted to the first outer side 10a. The first external electrode 8a is connected to every first internal electrode layer 5a via the electrically conductive material 6 on the first outer side 10a and is insulated from the other internal electrode layers 5b. On the opposite second outer side 10b, the second external electrode 8b is connected to every second internal electrode layer 5b and insulated from the first internal electrode layers 5a.

FIGS. 3A to 3E show a basic schematic diagram for an alternative production method for producing the piezoelectric multilayer component 1 shown in FIG. 1 by means of photosensitive material 2.

Firstly, insulating material 3 is applied on a first outer side 10a of the main body 11. The insulating material 3 is embodied as a glass coating, for example. Photosensitive material 2 is subsequently applied to the insulating material 3. With an individually adapted exposure mask 4, the photosensitive material 2 is structured by means of an exposure 7 in accordance with the principle of optical lithography. By way of example, exposed regions of the photosensitive material 2 decompose. Alternatively, exposed regions of the photosensitive material 2 can be removed using a solvent A which, for example, dissolves the exposed regions but not the unexposed regions of the photosensitive material 2.

As shown in FIG. 3B, the photosensitive material 2 is structured on the first outer side 10a such that a strip of photosensitive material 2 is present above every second internal electrode layer 5b, while no photosensitive material is situated above the first internal electrode layers 5a. The layer of insulating material 3 applied below the photosensitive material 2 remains unchanged up to that point.

As shown in FIG. 3C, the insulating material 3 is likewise removed, in a subsequent step, at the locations freed of photosensitive material 2. What is achieved as a result is that every first internal electrode layer 5a is uncovered, and every second internal electrode layer 5b is covered with insulating material 3 and photosensitive material 2. On a second outer side 10b, the second internal electrode layers 5b are equally uncovered.

The insulating material 3 is removed, for example, by means of an etching medium which, although it etches the insulating material 3, does not etch the photosensitive material 2. Consequently, the photosensitive material 2 serves as a mask for the targeted removal of the insulating material 3. Alternatively, the insulating material 3 can contain a mixture of glass powder and binder, which can be incipiently dissolved by a solvent B, for example. The solvent B can be water, for example. The photosensitive material 2 cannot be incipiently dissolved in solvent B.

In the next method step, the photosensitive material 2 is completely removed. For example, the photosensitive material 2 can be removed mechanically by means of sandblasting, grinding or milling. Alternatively, the photosensitive material 2 can be removed by a solvent C, for example. The solvent C can, for example, dissolve the unexposed regions of the photosensitive material 2, but not the insulating material 3. The solvents A, B and C described are preferably different solvents which selectively remove the different materials. By way of example, one of the solvents A, B or C is water.

As a result, the intermediate stage shown in FIG. 3D is obtained, in which alternately every second internal electrode layer 5b is covered with insulating material 3. The first internal electrode layers 5a are uncovered.

In a subsequent method step, electrically conductive material 6, for example, a metal paste, is applied to the first outer side 10a of the main body 11. As a result, every first internal electrode layer 5a is covered with electrically conductive material 6. The second internal electrode layers 5b are covered by insulating material 3. The electrically conductive material 6 is subsequently subjected to binder removal and fired. On the opposite second outer side 10b, the second internal electrode layers 5b are covered with electrically conductive material 6, while the first internal electrode layers 5a are covered with insulating material 3 (not illustrated).

FIGS. 4A to 4F show a basic schematic diagram for a further production method for producing the piezoelectric multilayer component 1 shown in FIG. 1 by means of photosensitive material 2. This production method proceeds similarly to the production method in accordance with FIGS. 2A to 2F, with the difference that the electrically conductive material 6 is applied before the insulating material 3.

Firstly, as shown in FIG. 4A, a photosensitive material 2 is applied to a first outer side 10a of the main body 11 of a multilayer component 1. The photosensitive material 2 is subsequently structured by means of an exposure 7 via an exposure mask 4 in accordance with the principle of optical lithography.

As shown in FIG. 4B, the photosensitive material 2 is structured such that every second internal electrode layer 5b is covered with photosensitive material 2.

Electrically conductive material 6 is subsequently applied to the uncovered first internal electrode layers 5a. The electrically conductive material 6 is a metallization paste, for example, which is applied to the first outer side 10a selectively provided with photosensitive material 2. Alternatively, the first outer side 10a selectively provided with photosensitive material 2 can be coated with electrically conductive material 6, for example, with a metallic material, for example, by means of printing, spraying, sputtering or chemical vapor deposition.

In a subsequent method step, the rest of the photosensitive material 2 is removed in a lift-off method, for example. The electrically conductive material 6 adhering to the photosensitive material 2 is likewise removed in this case. Under certain circumstances, before the removal of the photosensitive material 2, an additional process step is required which ensures that the photosensitive material 2 is not covered with electrically conductive material 6, as shown in FIG. 4D. Such excess electrically conductive material 6 can be removed by sandblasting, grinding or milling, for example. Alternatively, the excess electrically conductive material can be removed by lapping.

As shown in FIG. 4E, every first internal electrode layer 5a is then covered with electrically conductive material 6, while the second internal electrode layers 5b are uncovered.

As shown in FIG. 4F, insulating material 3 is subsequently filled into the trenches above the uncovered second internal electrode layers 5b. In this case, the insulating material 3 has, for example, a different adhesion behavior to metal and to ceramic. As a result, the insulating material 3 adheres selectively to every second internal electrode layer 5b not covered with electrically conductive material 6. The electrically conductive material 6 is not covered by insulating material 3.

According to the same procedure, on the opposite second outer side 10b, the second internal electrode layers 5b are covered with electrically conductive material and the first internal electrode layers 5a are covered with insulating material (not illustrated).

Two external electrodes for the electrical contact-connection of the internal electrode layers 5a, 5b covered with electrically conductive material 6 are subsequently fitted. The external electrodes are fitted to the opposite outer sides 10a, 10b of the multilayer component 1. By way of example, the external electrodes are soldered on.

FIGS. 5A to 5C respectively show in a side view an excerpt from a piezoelectric component, wherein a different positioning of an insulation web 15 on an internal electrode layer 5a is shown, respectively. Such different positioning can occur, in particular, if different distances 13 between the internal electrode layers 5a, 5b arise on account of tolerances during the production process, and the structure of the exposure mask 4 does not correspond exactly to the arrangement of the internal electrode layers 5a, 5b.

FIG. 5A shows an ideal case, wherein an insulation web 15 is arranged centrally above every second internal electrode layer 5b on an outer side 10a, such that every second internal electrode layer 5b is insulated. The width 17 of the insulation web 15 is greater than the distance 13 between two adjacent internal electrode layers. By way of example, the width 17 is greater than the width of the contact web 16 by the factor 1.3 to 1.5. Every first internal electrode layer 5a on the outer side 10a can be electrically contact-connected.

FIG. 5B shows a borderline case, wherein the insulation web 15 is no longer arranged centrally above a second electrode layer 5b, but a contact-connection of the first internal electrode layers 5a on an outer side 10a is still just achieved. The insulation web 15 is arranged above a second internal electrode layer 5b such that it just fails to cover the adjacent first internal electrode layer 5a. Consequently, a contact-connection of the first internal electrode layer 5a is possible. In this case, the insulation web 15 is wider than the distance 13 between two adjacent internal electrode layers 5a, 5b by the width x.

The width x is preferably calculated according to the formula $x=(d_E-d_K)$, wherein $d_E$ is the distance 13 between two internal electrode layers 5a, 5b and $d_K$ is the width of the contact web 16 in the stacking direction. The width x is, for example, at least 1/21 times the distance 13 between two adjacent internal electrode layers 5a, 5b, corresponding to an insulation web that is 1.1 times as wide as a contact web. The width x is, for example, up to 1/3 times the distance 13 between two adjacent internal electrode layers 5a, 5b, corresponding to an insulation web that is 2 times as wide as a contact web. The width x is, for example, 3/23 to 1/5 times the distance 13 between two adjacent internal electrode layers 5a, 5b, corresponding to an insulation web that is 1.3 to 1.5 times as wide as a contact web. As a result of this overlap, despite the eccentric positioning of the insulation web 15, an insulation of the internal electrode layer 5b can still be achieved, such that the component can still function reliably.

The asymmetrical arrangement of the insulation web 15 above the second internal electrode layer 5b can be caused by nonuniform distances 13 between the internal electrode layers 5a, 5b. Said non-uniform distances can arise, for example, as a result of pressing warpage or different sintering shrinkage during the production process.

FIG. 5C shows a case wherein a contact-connection of the first internal electrode layers 5a on an outer side 10a is no longer possible. The insulation web 15 is arranged on the outer side 10a such that two adjacent internal electrode layers 5a, 5b are covered with insulating material 3 by virtue of the insulation web 15. The functionality of a multilayer component can be restricted when such an incorrect contact-connection occurs. Such defective components can easily be determined by means of a measurement and are sorted out as rejects.

FIG. 6 shows a multilayer component 1 comprising non-contact-connected regions 14 in a side view. On account of different distances between the internal electrode layers 5a, 5b, a plurality of adjacent internal electrode layers 5a, 5b are covered with insulating material on an outer side 10a, 10b. By way of example, internal electrode layers 5a, 5b are covered by insulating material 3 on both outer sides 10a, 10b. Non-contact-connected regions 14 arise as a result. A component comprising non-contact-connected regions 14 is defective and can be identified by means of a measurement and sorted out. Consequently, a failure during operation can be prevented.

The invention claimed is:

1. A method for producing an electric contact-connection of a multilayer component, the method comprising:
   providing a main body of the multilayer component having internal electrode layers;
   applying an electrically conductive material;
   applying a photosensitive material on the electrically conductive material;
   structuring the electrically conductive material via the photosensitive material such that the internal electrode layers alternatingly are covered and uncovered by the electrically conductive material; and
   applying an insulating material after structuring the electrically conductive material such that the internal electrode layers are alternatingly covered by the electrically conductive material and by the insulating material.

2. The method according to claim 1, further comprising completely removing the photosensitive material after structuring the electrically conductive material.

3. The method according to claim 1, wherein structuring the electrically conductive material comprises providing the photosensitive material as an etching stop.

4. The method according to claim 1, further comprising structuring the photosensitive material, wherein structuring the electrically conductive material and structuring the photosensitive material include using three different solvents.

5. The method according to claim 4, wherein one of the three solvents is water.

6. The method according to claim 1, further comprising measuring the main body to determine a position of the internal electrode layers before applying the photosensitive material.

7. The method according to claim 6, further comprising structuring of the photosensitive material is effected by an exposure mask, wherein the exposure mask is selected in accordance with a result of the measuring of the main body.

8. The method according to claim 1, wherein the insulating material and the electrically conductive material are arranged in strip-shaped fashion alternatingly above the internal electrode layers.

* * * * *